United States Patent
Lilak et al.

(10) Patent No.: US 11,495,683 B2
(45) Date of Patent: Nov. 8, 2022

(54) MULTIPLE STRAIN STATES IN EPITAXIAL TRANSISTOR CHANNEL THROUGH THE INCORPORATION OF STRESS-RELIEF DEFECTS WITHIN AN UNDERLYING SEED MATERIAL

(71) Applicant: Intel Corporation, Santa Clara, CA (US)

(72) Inventors: Aaron Lilak, Beaverton, OR (US);
Patrick Keys, Portland, OR (US);
Sayed Hasan, Portland, OR (US);
Stephen Cea, Hillsboro, OR (US);
Anupama Bowonder, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 16/795,473

(22) Filed: Feb. 19, 2020

(65) Prior Publication Data
US 2021/0257492 A1 Aug. 19, 2021

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02381* (2013.01); *H01L 29/086* (2013.01); *H01L 29/1045* (2013.01); *H01L 29/1054* (2013.01); *H01L 29/165* (2013.01); *H01L 29/66795* (2013.01); *H01L 29/66803* (2013.01); *H01L 29/7378* (2013.01); *H01L 29/7845* (2013.01)

(58) Field of Classification Search
CPC .......... H01L 29/7848; H01L 21/02381; H01L 29/086; H01L 29/1045; H01L 29/1054; H01L 29/165; H01L 29/7845; H01L 29/66795; H01L 29/66803; H01L 29/7378
See application file for complete search history.

(56) References Cited

U.S. PATENT DOCUMENTS

| | | | |
|---|---|---|---|
| 2011/0147811 A1* | 6/2011 | Kavalieros | H01L 29/7851 257/288 |
| 2011/0295571 A1* | 12/2011 | Suzuki | H01L 21/26513 703/2 |

(Continued)

*Primary Examiner* — Michael Jung
(74) *Attorney, Agent, or Firm* — Essential Patents Group, LLP

(57) ABSTRACT

Multiple strain states in epitaxial transistor channel material may be achieved through the incorporation of stress-relief defects within a seed material. Selective application of strain may improve channel mobility of one carrier type without hindering channel mobility of the other carrier type. A transistor structure may have a heteroepitaxial fin including a first layer of crystalline material directly on a second layer of crystalline material. Within the second layer, a number of defected regions of a threshold minimum dimension are present, which induces the first layer of crystalline material to relax into a lower-strain state. The defected regions may be introduced selectively, for example a through a masked impurity implantation, so that the defected regions may be absent in some transistor structures where a higher-strain state in the first layer of crystalline material is desired.

23 Claims, 8 Drawing Sheets

(51) Int. Cl.
*H01L 29/08* (2006.01)
*H01L 29/10* (2006.01)
*H01L 29/165* (2006.01)
*H01L 29/737* (2006.01)
*H01L 21/02* (2006.01)

(56) References Cited

U.S. PATENT DOCUMENTS

| | | | |
|---|---|---|---|
| 2015/0120392 A1* | 4/2015 | Gharachorloo | G06Q 30/0201 |
| | | | 705/7.34 |
| 2016/0218007 A1* | 7/2016 | Wen | H01L 29/6656 |
| 2016/0322220 A1* | 11/2016 | Reznicek | H01L 21/02532 |
| 2017/0069549 A1* | 3/2017 | Basker | H01L 21/823878 |
| 2017/0170014 A1* | 6/2017 | Basker | H01L 21/02381 |
| 2017/0236704 A1* | 8/2017 | Dasgupta | H01L 21/0265 |
| | | | 257/76 |
| 2019/0189739 A1* | 6/2019 | Li | H01L 29/785 |
| 2019/0207028 A1* | 7/2019 | Cheng | B82Y 10/00 |
| 2020/0335601 A1* | 10/2020 | Liu | H01L 29/66545 |
| 2021/0082771 A1* | 3/2021 | Kao | H01L 21/02211 |

* cited by examiner

MULTIPLE STRAIN STATES IN EPITAXIAL TRANSISTOR CHANNEL THROUGH THE INCORPORATION OF STRESS-RELIEF DEFECTS WITHIN AN UNDERLYING SEED MATERIAL

BACKGROUND

Demand for higher performance integrated circuits (ICs) in electronic device applications has motivated increasingly complex transistor architectures. Some transistor structures include multiple layers of crystalline semiconductor material engineered to induce strain within a channel layer of the transistor because certain types of strain have been found to increase charge carrier mobility, reducing the time needed for a charge carrier to transit between source and drain terminals, across a channel of a given length.

However, because benefits of channel strain are dependent on the polarity of the charge carrier (e.g., electron vs. hole) it is important to introduce channel strain of a given type (compressive vs. tensile) selectivity to only the subset of transistor structures within a complementary metal-oxide-semiconductor (CMOS) IC that will benefit. For example, one may wish to decrease hole transit times to speed up PMOS transistor structures without negatively impacting electron transit times in adjacent NMOS transistor structures. This goal can be challenging to implement in high volume manufacture of CMOS ICs as it may require PMOS and NMOS transistor structures to have two different channel materials (e.g., one material that is strained and one that is not), and/or two different channel encapsulants (e.g., a high and low or compressive/tensile stressed dielectric), and/or two different source/drain materials (e.g., a high and low or compressive/tensile stressed raised epitaxy), etc. Beyond the complexity of selectively forming or patterning any such materials, the selective incorporation of dissimilar material layers might induce further manufacturing complexities. For example, PMOS transistors may be required to have a different height than NMOS transistors, which sacrifices the simplicity inherent to a highly planar device layer. Transistor architectures and fabrication techniques that can avoid these issues would therefore be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
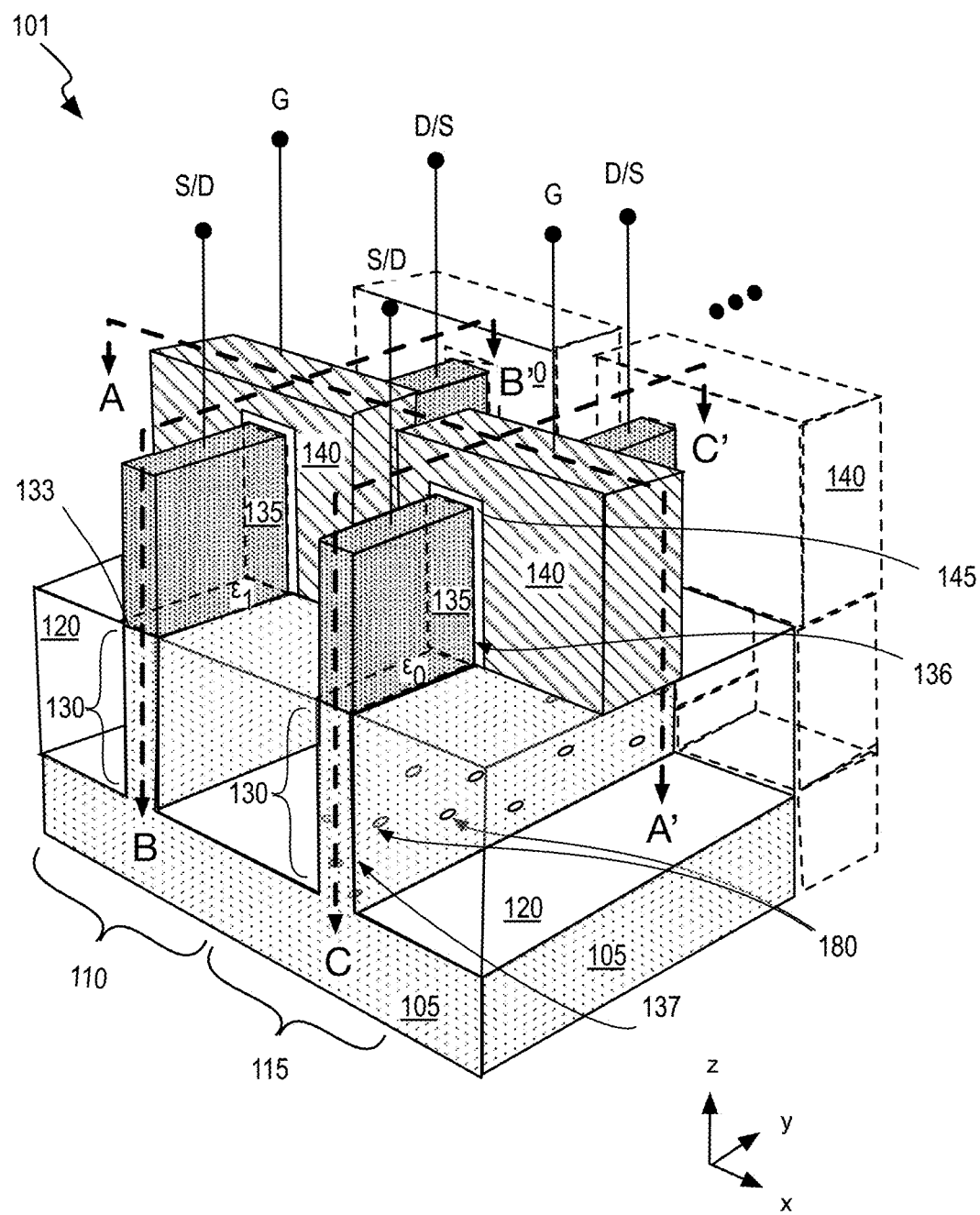
FIG. 1 illustrates an isometric view of an IC structure including transistor structures having channel material with multiple strain states, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, one or more defected regions are selectively incorporated into a crystalline material that is at, or near, a base of a stratified fin structure that further includes, a channel region of a different crystalline material. The inventors have found such defected regions can be generated, for example through the implantation of one or more dopant species into the sub-channel material. The inventors have further found that such defected regions can relieve stress that would otherwise be present within the channel crystalline material that is at, or near, a top of the stratified transistor fin structure. With stress relief, the crystalline channel material can be in a more-relaxed (or less strained) state than it would be otherwise. Hence, the channel material of a particular fin may be controlled to be in a more-strained state, or a less-strained state depending on whether defected regions are incorporated in an underlying sub-fin material.

As described further below, selective strain relief in accordance with embodiments herein may be applied to a stratified transistor structure according to a variety of rubrics. In some embodiments where one crystalline material is employed as a channel in transistors of two complementary polarities, a given channel material may be set to a more-strained state for a transistor of a first polarity (e.g., p-type), and set to a less-strained state for a transistor of a second polarity (e.g., n-type). A higher carrier (e.g., hole) mobility may be achieved in the given channel material of the transistor having the first polarity because of the more-strained state, while the less-strained state within a transistor of the second polarity also permits a higher carrier (e.g., electron) mobility in the given channel material. Hence, a single channel material may be employed for transistors of complementary polarities, and strain-induced mobility enhancement may be leveraged in the channel of one of the transistor polarities without also imparting that same strain (and incurring a strain-induce mobility reduction) in the channel of the complementary transistor polarity.

In some other examples where a first crystalline material is employed as a buffer layer within a stratified transistor structure, transistors of complementary conductivity types may further employ two different channel materials that are in complementary strain states (e.g., one compressively strained while the other is tensilely strained). A buffer layer between an overlying crystalline transistor channel material and an underlying crystalline material, may, for example be in either a more-strained state, or a less-strained state as a function of the presence of defected regions in the underlying crystalline material and/or in the buffer layer. In the absence of defected regions, the buffer layer may be in a more (e.g., compressively) strained state, and, as a result of the more strained buffer state, the first transistor channel material may be in a first (e.g., tensilely) strained state. In the presence of defected regions, the buffer layer may be in a more relaxed/less (e.g., compressively) strained state. As a result of the more relaxed buffer state, the second transistor channel material may be in a second (e.g., compressively) strained state with a greater magnitude of strain than would otherwise be present if the buffer layer remained in the more strained/less relaxed state. Hence, setting a transistor buffer layer to a first strain state according to embodiments herein may impart a first type of strain (e.g., tensile) to a first channel material that has some suitable lattice mismatch with the buffer layer (e.g., a smaller in-plane lattice constant than that of the strained buffer). The first channel material may therefore have a higher carrier (e.g., electron) mobility. Setting a transistor buffer layer to a second strain state (e.g., relaxed) according to embodiments herein may impart a greater amount of complementary strain (e.g., compressive) to a second channel material that has some suitable lattice mismatch with the buffer layer (e.g., a larger lattice constant than that of the relaxed buffer layer. The second channel material may therefore also have a higher carrier (e.g., hole) mobility.

Methods of fabricating such transistor structures are also described below. In some embodiments, one or more dopant species may be selectively implanted so that the implantation end-of-range falls somewhere within a crystalline sub-channel layer. At the end-of-range, where the impurity species comes to rest, maximum lattice damage may occur. Under a sufficiently high implant dose, this implant-related damage to the crystalline sub-channel layer can induce an overlying pseudomorphic lattice-mismatched layer to become more relaxed. An implant dose may vary with the dopant species, and as also described below, the implant species may in some instances be selected for greater lattice damage rather than greater electrical activation. Alternatively, an implant species suitable for achieving a desired well-doping may be dosed more extremely so as to also generate a number of defected regions sufficient to set a desired channel material strain state. Alternatively, or additionally, impurity ions may be implanted at a reduced temperature so as to generate a greater lattice damage per implanted ion relative to an implant done at a higher temperature (ie room temperature or hotter).

FIG. 1 illustrates an isometric view of an IC structure 101 including transistor structures 110 and 115 that further include semiconductor material 135 with multiple strain states, $\varepsilon_0$ and $\varepsilon_1$, in accordance with some embodiments. IC structure 101 illustrates only a portion of a monolithic IC that may be over and/or on any suitable substrate (not depicted). The monolithic IC may further include any number of metallization layers (not depicted) that electrically interconnect gate (G), source (S) and drain (D) terminals of transistor structure 110, 115 to various circuit nodes. In this example, each of transistor structures 110 and 115 is a metal-oxide-semiconductor field effect transistor (MOSFET) 110 that includes a substantially monocrystalline semiconductor material 135 for at least a channel region of each transistor structure 110 and 115. As shown, the channel region is coupled a gate stack that further includes a gate electrode 140 separated from semiconductor material 135 by a gate dielectric 145. In the illustrated embodiment, transistor structures 110, 115 are both non-planar devices in which the channel region of semiconductor material 135 is a fin structure with the gate stack laterally adjacent to at least a channel semiconductor material sidewall 136. Transistor structures 110, 115 may therefore be referred to a finFETs. Other multi-gate structures are also possible. Although only two gate stacks are illustrated for the sake of clarity, additional gate stacks (e.g., 2-50, or more) may extend along a length of a fin structure. For example, additional gate electrodes 140 are denoted in dashed outlines. Similarly, although each gate stack is over only one fin structure for the sake of clarity, a gate stack may instead be coupled to multiple fin structures (e.g., 2-10, or more).

Gate electrode 140 may include an elemental metal layer, a metal alloy layer, or laminate structure of either or both elemental and alloy layers. Gate electrode 140 may have any composition suitable for the composition of semiconductor material 135. In some embodiments, gate electrode 140 is a metal nitride, such as TiN. Gate electrode 140 may also comprise Al (e.g., TiAlN), for example. Other alloy constituents may also be employed in gate electrode 140, such as, but not limited to C, Ta, W, Pt, and Sn. Gate dielectric 145 separates gate electrode 140 from a channel region of semiconductor material 135. Gate dielectric 145 may be any material(s) compatible with semiconductor material 135 and gate electrode 140. While any gate dielectric known to be suitable for a particular channel material may be utilized, in some exemplary embodiments the gate dielectric 145 is high-k dielectric material (e.g., with a bulk relative permittivity greater than 7.5). Exemplary high-k materials include dielectric metal oxides. In some examples, the gate dielectric comprises oxygen and at least one of Hf (e.g., $HfO_2$), Al (e.g., $Al_2O_3$), Zr (e.g., $ZrO_2$), Y (e.g., $Y_2O_3$), Ta (e.g., $Ta_2O_5$), or Ti (e.g., $TiO_2$). Silicates, such as, but not limited to $HfSiO_x$, or $TaSiO_x$ may also be suitable. In other embodiments gate dielectric 145 is $SiO_2$, or SiON. In some embodiments, gate dielectric 145 includes multiple material layers. For example, a $SiO_2$ layer may be in contact with channel semiconductor, and a high-k dielectric material over (in contact with) the $SiO_2$ layer.

On opposite sides of the gate stack there is a drain or source (D/S) terminal coupled to a channel region of semiconductor material 135. Source and drain semiconductor material may be an integral part of the fin, in which case the source/drain and/or drain/source terminals may be coupled to the channel region through an extrinsic portion of semiconductor material 135, as illustrated. (e.g., portions of the fin structure beyond the gate stack illustrated in FIG. 1). Alternatively, the extrinsic portion of semiconductor material 135 may be replaced with epitaxial source and/or drain semiconductor material as embodiments herein are not limited in this context. Embodiments with epitaxial source and/or drain semiconductor material may have any structure within the extrinsic semiconductor region, and need not maintain the fin structure beyond the channel region in the manner illustrated for semiconductor material 135.

As shown, semiconductor material 135 is over, and in contact with, an underlying semiconductor material 130. Semiconductor material 130 is also substantially monocrystalline, and has a sidewall 137 laterally adjacent to an isolation dielectric material 120 to further define a non-planar stratified fin structure. Semiconductor material 130 is therefore a lower portion (or sub-channel portion) of the fin with semiconductor material 135 being an upper portion (or channel portion). Having multiple semiconductor material layers, or strata, the fin structure may be referred to as a stratified fin or fin heterostructure. In this example, semiconductor material 130 is contiguous with a substrate layer 105. Hence, substrate layer 105 has substantially the same chemical composition as semiconductor material 130. In alternative embodiments however, a stratified fin may include more than two semiconductor material layers.

Notably, the majority lattice atom composition and film thickness (e.g., z-dimension) of semiconductor material 130 are substantially the same in both transistor structures 110 and 115. Likewise, the majority lattice atom composition and film thickness (e.g., z-dimension) of semiconductor material 135 are substantially the same in both transistor structures 110 and 115. Semiconductor material 130 has a different chemical composition than semiconductor material 135 such that there is a heterojunction 133 at their interface. More specifically, semiconductor material 130 has first majority lattice atom composition while semiconductor material 135 has second majority lattice atom composition to distinguish from semiconductor materials that merely have different minority dopants. In some embodiments, both of semiconductor materials 130 and 135 are Group IV semiconductor materials (e.g., Si, Ge, or a alloy lattice atoms). In some such embodiments, one of semiconductor materials 130 and 135 has a higher concentration of Ge lattice atoms than the other. Hence, for embodiments where semiconductor material 130 is substantially pure silicon, semiconductor material 135 is a alloy. In some such embodiments, x is no more than 0.8 (e.g., x=0.6-0.8, 1−x=0.2-0.4, etc.). Alternatively, for embodiments where semiconductor material 135 is substantially pure Si, semiconductor material 130 is a $Si_xGe_{1-x}$ alloy. In other embodiments, where semiconductor material 135 is a $Si_xGe_{1-x}$ alloy, semiconductor material 130 is a $Si_yGe_{1-y}$ alloy with a different Ge fraction (e.g., with y>x, or x>y). In other embodiments, where semiconductor material 135 is substantially pure Ge, semiconductor material 130 is a $Si_xGe_{1-x}$ alloy. In still other embodiments, where semiconductor material 130 is substantially pure Ge, semiconductor material 135 is a $Si_xGe_{1-x}$ alloy. Although, many embodiments are described in the context of exemplary $Si/Si_xGe_{1-x}/Ge$ systems, other semiconductor material systems, such as, but not limited to Group III-V alloy systems, may also be possible. For example, a stratified fin may include two or more different Group III-V alloys.

Having different majority lattice atom compositions, semiconductor material 135 has a relaxed lattice constant that is different than the relaxed lattice constant of semiconductor material 130. For example, substantially pure crystalline silicon has a relaxed lattice constant of approximately 0.543 nm while substantially pure crystalline germanium has a relaxed lattice constant of approximately 0.566 nm. For $Si_xGe_{1-x}$ alloys, the relaxed lattice constant can be approximated by linear interpolation as a function of x. In exemplary embodiments, semiconductor material 135 within transistor structure 110 is pseudomorphic. Being pseudomorphic, the in-plane (e.g., x-y) lattice parameter of semiconductor material 135 coherently strains from its relaxed lattice constant through elastic deformation so that the in-plane lattice constant of semiconductor material 135 matches the in-plane lattice constant of semiconductor material 130. Where semiconductor material 130 is sufficiently thick, it will remain unstrained by semiconductor material 135. However, semiconductor material 130 may also strain to some extent as embodiments herein are not limited in this respect.

Depending on the majority lattice atom compositions of semiconductor materials 130 and 135, the pseudomorphic state of semiconductor material 135 will either be elastically compressed bi-axially in the two in-plane directions (x and y), or elastically tensed in the two in-plane directions. Hence, in some exemplary embodiments where semiconductor material 130 is substantially pure silicon, and semiconductor material 135 is pseudomorphic $Si_xGe_{1-x}$, semiconductor material 135 becomes more compressively strained with increasing Ge composition. For such embodiments, transistor structure 110 is advantageously a PMOS device in which charge carriers (holes) traversing a channel region of semiconductor material 135 will enjoy higher mobility as a result of the compressive strain. In one specific PMOS example where semiconductor material 130 is substantially pure silicon, semiconductor material 135 is pseudomorphic $Si_{0.7}Ge_{0.3}$. In some other exemplary embodiments, semiconductor material 130 may be $Si_yGe_{1-y}$, and semiconductor material 135 is pseudomorphic $Si_xGe_{1-x}$, where x is less than y. For any of these PMOS embodiments, source/drain terminals of transistor structure 110 may be coupled to semiconductor material 135 through p-type extrinsic source and drain semiconductor material. Source/drain material may include any electrically active acceptor species known to be suitable for a p-type device as embodiments are not limited in this respect. For example, a Group IV p-type source and drain semiconductor may include boron or gallium as a p-type dopant.

In some other exemplary embodiments, semiconductor material 130 is pure Ge or $Si_yGe_{1-y}$, and semiconductor material 135 within transistor structure 110 is pseudomorphic Si or $Si_xGe_{1-x}$, where x is greater than y. For such embodiments, semiconductor material 135 becomes more tensilely strained with decreasing Ge composition. Transistor structure 110 may then be advantageously an NMOS device in which charge carriers (electrons) traversing a channel region of semiconductor material 135 have a higher mobility as a result of the tensile strain. In one specific NMOS example where semiconductor material 130 is substantially pure Ge, semiconductor material 135 is pseudomorphic $Si_{0.3}Ge_{0.7}$. In another specific NMOS example where semiconductor material 130 is $Si_{0.5}Ge_{0.5}$, semiconductor material 135 is pseudomorphic $Si_{0.7}Ge_{0.3}$. In another specific NMOS example where semiconductor material 130 is Ge, semiconductor material 135 is pseudomorphic $Si_{0.3}Ge_{0.7}$. For any of these NMOS embodiments, source/drain terminals of transistor structure 110 may be coupled to semiconductor material 135 through n-type (extrinsic) source and drain semiconductor material. Such source and drain material may be an integral part of the fin (e.g., portions of the fin beyond the gate stack illustrated in FIG. 1), or may have replaced a portion of the fin beyond the gate stack and/or grown over a portion of the fin beyond the gate stack. For any implementation, the source/drain material may have any electrically active donor species known to be suitable for a n-type device as embodiments are not limited in this respect. For example, a Group IV n-type source and drain semiconductor may include phosphorus or arsenic as an n-type dopant.

In further embodiments, semiconductor material 135 within transistor structure 115 is metamorphic. As metamorphic, an in-plane (e.g., x-y) lattice parameter of semiconductor material 135 is less strained or more relaxed than the pseudomorphic state it has within transistor structure 110. In a relaxed strain state $\varepsilon_0$, semiconductor material 135 the in-plane lattice constant of semiconductor material 135 does not match the in-plane lattice constant of semiconductor material 130. Notably, semiconductor material 135 within transistor structure 115 advantageously has substantially the same chemical composition and substantially the same thickness as the semiconductor material 135 within transistor structure 110. Likewise, semiconductor material 130 within transistor structure 115 advantageously has substantially the same chemical composition and substantially the same thickness as the semiconductor material 130 within transistor structure 110.

As further shown in FIG. 1, semiconductor material 130 within transistor structure 115 further includes a number of defected regions 180. The inventors have found defected regions 180 within a seed layer can alter the strain state of an epitaxial layer. More specifically, the defected regions 180 can decouple in-plane strain of an epitaxial layer from the seed layer. An epitaxially layer may then be relaxed from a strained state depending on, for example, one or more of the number (density) or dimension of defected regions 180 present within semiconductor material 130. As such, an area selective introduction of defected regions 180 can manipulate the strain state of semiconductor material 135. In the illustrated example, semiconductor material 135 is in a pseudomorphic strain state $\varepsilon_1$ within transistor structure 110 as a result of there being few defected regions 180 within semiconductor material 130 of transistor structure 110. However, semiconductor material 135 within transistor structure 110 is in metamorphic strain state $\varepsilon_0$ (e.g., fully relaxed) as a result of there being a sufficient number of defected regions 180 within semiconductor material 130 of transistor structure 110.

In some exemplary embodiments where semiconductor material 130 is substantially pure silicon, and semiconductor material 135 is $Si_xGe_{1-x}$ (e.g., where x=0.7), compressively strained pseudomorphic $Si_xGe_{1-x}$ within a p-type transistor structure 110 may therefore have higher hole mobility, while a relaxed metamorphic $Si_xGe_{1-x}$ (e.g., x=0.7) within an n-type transistor structure 115 may have higher electron mobility in the absence of compressive strain (i.e., being in the more relaxed state). In some other exemplary embodiments where semiconductor material 130 is $Si_yGe_{1-y}$, and semiconductor material 135 is Si or $Si_xGe_{1-x}$ (y>x), tensilely strained pseudomorphic Si or $Si_xGe_{1-x}$ within an n-type transistor structure 110 may similarly have higher electron mobility, while a relaxed metamorphic $Si_xGe_{1-x}$ (y>x) within a p-type transistor structure 115 may also have higher hole mobility in the absence of tensile strain. Accordingly, IC structure 101 may be a CMOS structure where both NMOS and PMOS transistors have substantially the same stratified fin architecture (i.e., same fin heterostructure). Nevertheless, the NMOS and PMOS transistors have channel regions comprising a semiconductor material of significantly different strain states $\varepsilon_0$ and $\varepsilon_1$.

The number of defected regions 180 within a fin structure may vary, for example from around ten to a hundred, or more. The density of defected regions 180 is low enough that semiconductor material 130 is not amorphous, but instead remains substantially monocrystalline. In some exemplary embodiments, a defected region 180 is an implant defect. Implant defects are extended physical disruptions of the crystalline lattice, which can result from the implantation of impurities at a certain concentration (atom/cm$^3$) or dose (atom/cm$^2$). Defected regions 180 will each have a threshold minimum dimension that is larger than a point defect. While a point defect is a single displaced atom, defected regions 180 may entail hundreds, or even thousands, of displaced atoms. As such, defected regions 180 are readily evident, for example with transmission electron microscopy (TEM) imagery, at a magnification less than that needed to image lattice structure and resolve individual point defects.

As described further below, defected regions 180 may be readily introduced selectively at the transistor level through the use of an implant mask that protects transistor structure 110 while transistor structure 115 is exposed to the defect generating implant. Defected regions 180 may also be located within specific regions of a single transistor structure. For example, within transistor structure 115, semiconductor material 135 is substantially free of defected regions 180. Likewise, substrate material 105 may also have few, if any, defected regions 180.

Figure 2A:
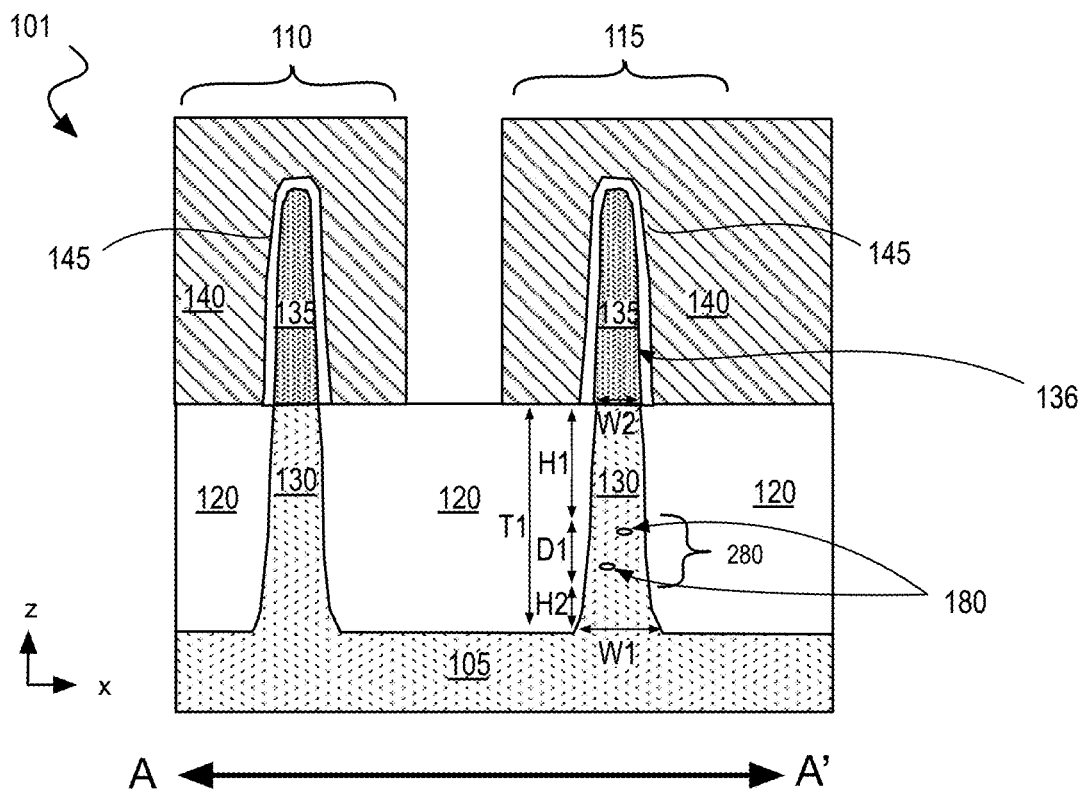
FIGS. 2A, 2B, and 2C illustrate cross-sectional views of the IC structure shown in FIG. 1, along particular planes, in accordance with some embodiments.
Figure 2B:
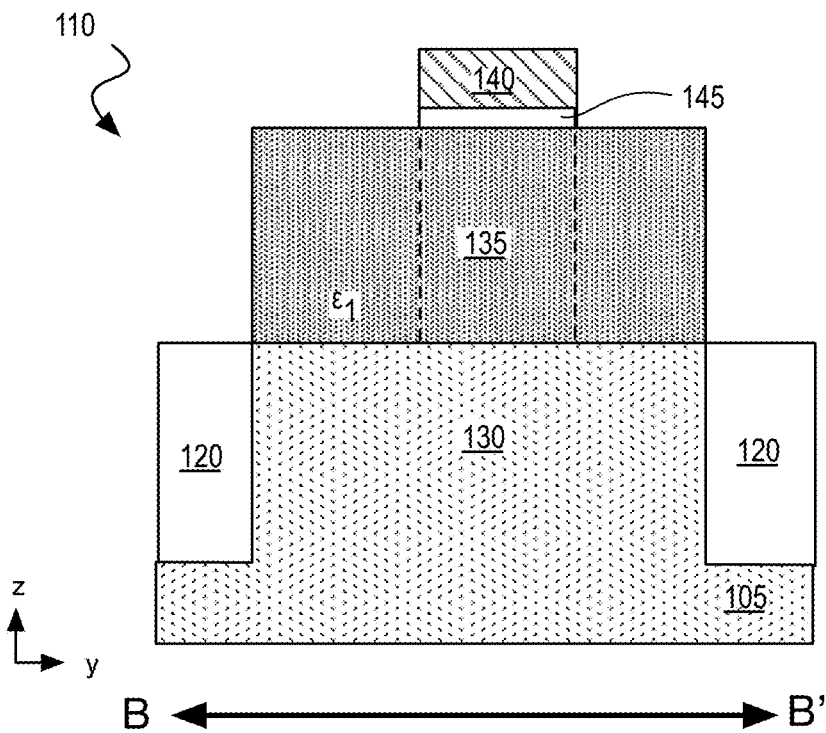
Figure 2C:
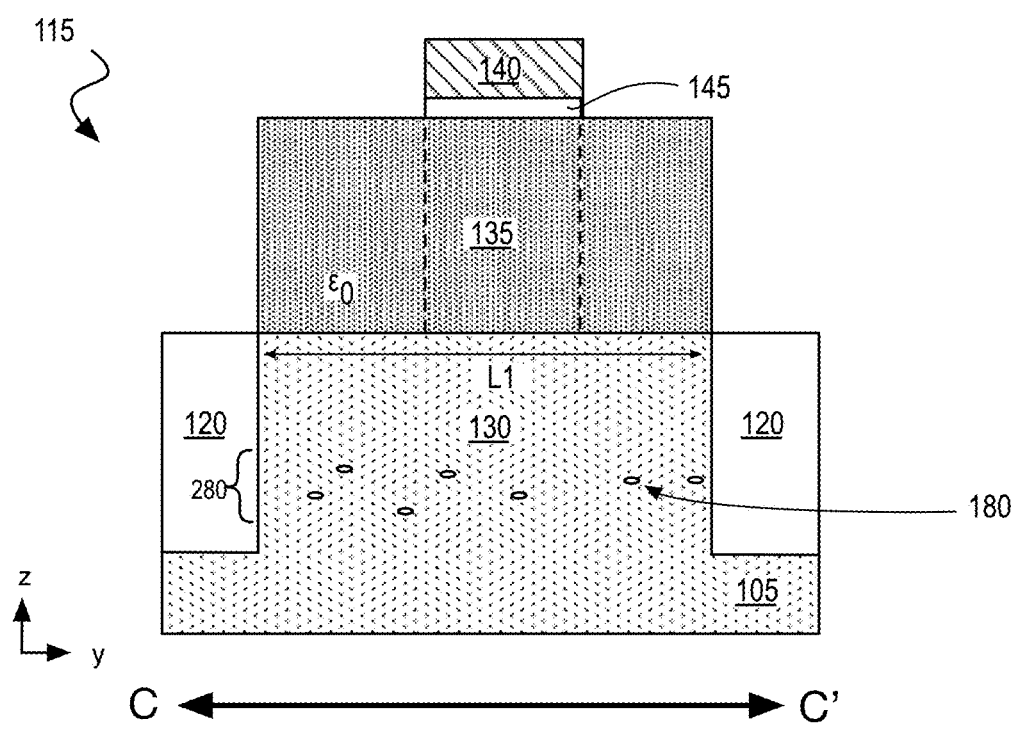

FIGS. 2A, 2B, and 2C illustrate cross-sectional views of IC structure 101 along A-A', B-B' and C-C' lines, respectively. FIG. 2A illustrates a portion of the transistor channel regions within a cross-section of the fin heterostructure for both transistor structures 110 and 115. As shown, defected regions 180 are substantially absent from semiconductor material 135. The exclusion of defected regions from the channel region may be advantageous so as to avoid introducing potential carrier scattering and/or recombination centers. As further shown, defected regions 180 are also substantially absent from substrate material 105. Defected regions 180 may be most prevalent within a band of semiconductor material 130. Defected regions band 280 may be substantially parallel to a plane of the substrate material 105 (e.g., x-y plane). Defected regions band 280 advantageous occupies less than the thickness T1 (e.g. z-dimension) of the semiconductor material 130. Hence, in the exemplary embodiments, defected regions 180 are not evenly distributed throughout the semiconductor material thickness T1. Limiting defected regions 180 to less than thickness T1 may advantageously limit any potential electrical impact these regions mighty otherwise have on transistor performance. For example, semiconductor material 135 may remain electrically isolated as defected regions band 280 should not enhance leakage through the entire semiconductor thickness T1. Although dimensions may vary, defected regions band 280 may have some depth D1 associated with an end-of-range depth distribution of one or more impurity species implanted to generate defected regions 180. Defected regions band 280 may be spaced below semiconductor material 135 by a height H1 that is a function of the depth D1, for example with a more tightly controlled end-of-rang depth allowing for a smaller height HE In some embodiments, H1 may be one-third to one-half of T1. As one example where semiconductor material thickness T1 is 20-60 nm, H1 may be ~10-30 nm. Defected regions band 280 may also be spaced above substrate material 105 (or the foot of the fin structure) by a height H2. Height H2 may be minimal (or nil) as defected regions 180 may be present within substrate 105 although defected regions within substrate 105 may do less to promote relaxation of semiconductor material 135 than do those within the fin structure.

As further shown in FIG. 2A, defected regions 180 may be dimensionally smaller than a transverse fin width. Noting that FIG. 1 is illustrated in block form for the sake of clarity, the cross-sectional profile of a fin heterostructure is more realistically illustrated in FIG. 2A with sidewalls of the fin structures shown as tapering from a larger transverse fin base width W1 to a smaller transverse fin channel width W2. Although dimensions may vary, width W1 may be 10-70 nm while width W2 may be 5-20 nm, for example.

FIG. 2B illustrates a longitudinal cross-section of the fin heterostructure for only transistor structure 110. Within semiconductor material 135, a dashed line demarks the channel region and extrinsic (source/drain) regions of semiconductor material 135. As shown, defected regions 180 are substantially absent from both semiconductor material 135 and semiconductor material 130. The illustrated semiconductor material 135 is therefore in a strained (either compressively or tensilely) state $\varepsilon_1$ dictated by the pseudomorphic lattice constant of semiconductor material 135 as it matches the lattice constant of semiconductor material 130.

FIG. 2C illustrates a longitudinal cross-section of the fin heterostructure for only transistor structure 115. As shown, defected regions 180 are present throughout a longitudinal fin length L1 of semiconductor material 130. The illustrated semiconductor material 135 is therefore in a relaxed (e.g., fully relaxed) state Co decoupled from the lattice constant of semiconductor material 130.

In addition to the presence of defected regions within only a subset of fin heterostructures of an IC, minority dopant concentrations can vary between semiconductor material having defected regions and semiconductor material free of defected regions. More specifically, semiconductor material having defected regions associated with an implantation of a minority species (impurity) will include a greater concentration of that impurity than semiconductor material free of the defected regions. In some embodiments, semiconductor material having defected regions further includes an impurity associated with imparting a particular conductivity type to the semiconductor material. For example, a donor or acceptor impurity suitable as an n-well or p-well impurity may serve the further purpose of inducing defected regions.

In some embodiments where transistor structure 115 is a PMOS device, semiconductor material 130 may be doped with a donor impurity to have a n-type conductivity. The complementary conductivity type of semiconductor material 130 may provide junction isolation to semiconductor material 135, improving electrical isolation of the PMOS device. Exemplary donor impurities having good activation efficiencies include, but are not limited to, arsenic or phosphorus. Whereas a relatively low concentration of such donor impurities (e.g., less than 1e17/cm$^3$) may be sufficient for junction isolation, the donor dopant concentration may be significantly higher (e.g., greater than 5e17/cm$^3$) so as to further induce a threshold number of defected regions 180. These impurity species, and an associated isotopic enrichment of semiconductor material 130, should be detectible with techniques, such as, but not limited to, secondary ion mass spectroscopy (SIMS).

Donor impurities having poor activation efficiencies may also be employed to generate defected regions. Antimony with its relatively high mass can be expected to efficiently generate defected regions, but not activate efficiently. For example, semiconductor material 130 within transistor structure 110 may include a threshold number of defected regions along with antimony at any suitable concentration. If sufficient n-well doping is not achieved with antimony alone (because of low electrical activation efficiency), semiconductor material 130 of transistor structure 115 may further include another donor impurity (e.g., phosphorus or arsenic). Embodiments including multiple impurity dopants having different activation and/or defect generation efficiencies may be advantageous for achieving both a desired electrical conductivity and a threshold number of defected regions 180.

In some alternative embodiments where transistor structure 115 is an NMOS device, semiconductor material 130 may be doped with an acceptor impurity to have a p-type conductivity. The complementary conductivity type of semiconductor material 130 may again provide junction isolation to semiconductor material 135, improving electrical isolation of the NMOS device. Exemplary acceptor impurities having good activation efficiencies include, but are not limited to, those comprising boron. Whereas a relatively low concentration of such donor impurities (e.g., less than 1e17/cm$^3$) may again be sufficient for junction isolation, even a much higher concentration of boron may not induce a threshold number of defected regions because of its low atomic mass. Hence, an alternative species capable of inducing greater lattice damage, such as $BF_2$, may present within semiconductor material 130 of transistor structure 115.

Acceptor impurities having poor activation efficiencies may also be employed to generate defected regions. For example, semiconductor material 130 within transistor structure 115 may include a threshold number of defected regions along with indium. If sufficient p-well doping is not achieved with indium alone, semiconductor material 130 of transistor structure 115 may further include another acceptor impurity (e.g., boron) for the sake of electrical activation.

In still other embodiments, semiconductor material having defected regions further includes impurity atoms other than those associated with imparting a particular conductivity type (n-type or p-type) to the semiconductor material. For such embodiments, the impurity atoms do not significantly activate electrically. The presence of such impurities within semiconductor material may therefore be indicative of their exclusive role in the origination of defected regions. In some examples, semiconductor material 130 of transistor structure 115 includes at least one of argon, xenon, nitrogen, fluorine. These species, and an associated isotopic enrichment of semiconductor material 130, should also be detectible with SIMS. In still other examples, silicon or germanium may be present, which may be more or less readily detected depending on the majority atom composition of semiconductor material 130.

Hence, in some specific examples where transistor structure 115 is a relaxed PMOS device and semiconductor material 135 comprises metamorphic Si or $Si_xGe_{1-x}$ having a relaxed lattice mismatched from that of a semiconductor material 130 comprising $Si_yGe_{1-y}$ (y<x) or substantially pure Ge, semiconductor material 130 of transistor structure 115 may further comprise any of arsenic, phosphorus, antimony, argon, xenon, nitrogen, fluorine, germanium or silicon, for example. As noted above, such impurities will be at significantly lower concentrations, if not completely absent, within semiconductor material lacking defected regions 180. For example, where transistor structure 110 is a strained NMOS device and semiconductor material 135 comprises pseudomorphic Si or $Si_xGe_{1-x}$ having a strained lattice matched to that of a semiconductor material 130 comprising $Si_yGe_{1-y}$ (y<x) or substantially pure Ge, semiconductor material 130 of transistor structure 110 may be substantially free of any of arsenic, phosphorus, antimony, argon, xenon, nitrogen, fluorine, germanium or silicon, for example. Semiconductor material 130 of transistor structure 110 may therefore only have a p-type well impurity (e.g., boron, etc.).

In other specific examples where transistor structure 115 is a relaxed NMOS device and semiconductor material 135 comprises metamorphic Ge or $Si_xGe_{1-x}$ having a relaxed lattice mismatched from that of a semiconductor material 130 comprising $Si_yGe_{1-y}$ (y>x) or substantially pure Si, semiconductor material 130 of transistor structure 115 may further comprise any of indium, argon, xenon, nitrogen, fluorine, germanium or silicon for example. Again, such impurities will be at significantly lower concentrations, if not completely absent, within semiconductor material lacking defected regions 180. For example, where transistor structure 110 is a strained PMOS device and semiconductor material 135 comprises pseudomorphic Ge or $Si_xGe_{1-x}$ having a strained lattice matched to that of a semiconductor material 130 comprising $Si_yGe_{1-y}$ (y>x) or substantially pure Si, semiconductor material 130 of transistor structure 110 may be substantially free of any of indium, argon, xenon, nitrogen, fluorine, or germanium, for example. Semiconductor material 130 of transistor structure 110 may therefore only have an n-type well impurity (e.g., phosphorus, arsenic, etc.).

Figure 3:
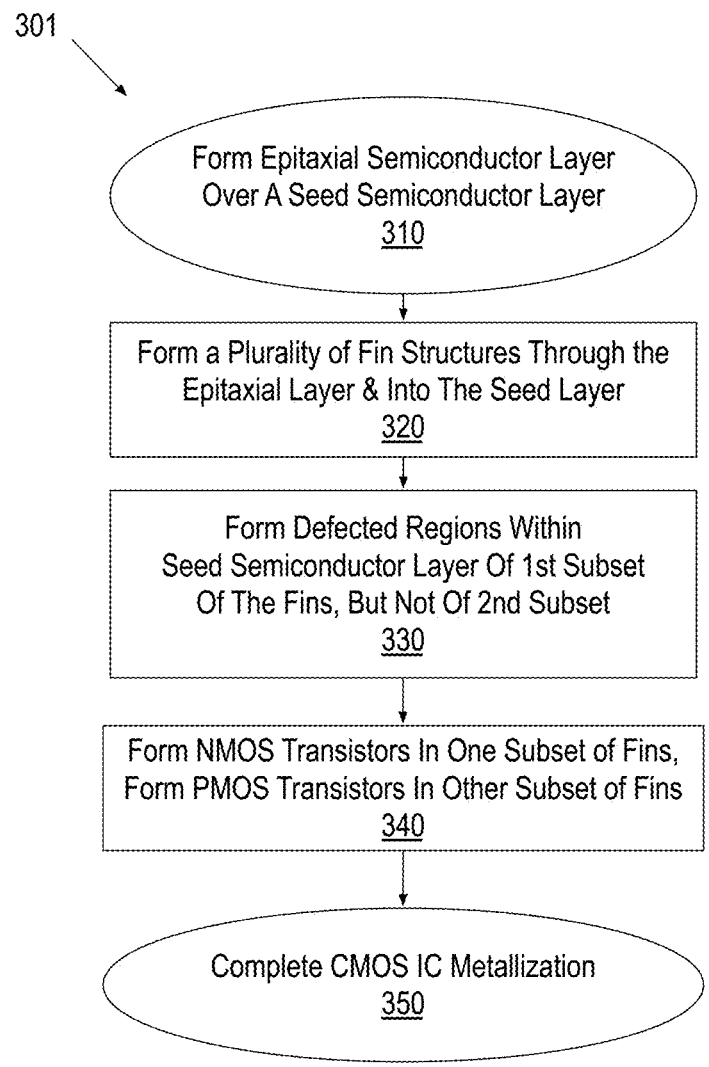
FIG. 3 is a flow diagram illustrating methods of fabricating transistor structures having channel material with multiple strain states, in accordance with some selective epitaxy embodiments.

The fin heterostructures IC structure introduced above may be fabricated by practicing to a wide variety of methods. FIG. 3 is a flow diagram illustrating methods 301 for fabricating transistor structures having channel material with multiple strain states, in accordance with some selective epitaxy embodiments. Methods 301 may be practiced to fabricate IC structures 101, for example.

Methods 301 begin at block 310 where an epitaxial semiconductor material layer is formed over a seed semiconductor layer. The seed semiconductor layer may be a material layer, or portion of a bulk substrate, or it may itself be a material that was previously formed over a substrate. Embodiments are not limited with respect to the origin of the seed semiconductor material layer. Any technique known to be suitable for growing an epitaxial layer in a pseudomorphic state may be employed to form the epitaxial semiconductor material layer over the seed semiconductor layer. In some embodiments, a wafer-level substrate or thin film of a seed semiconductor material layer is employed as the seed for a wafer-level growth of an epitaxial thin film. Alternatively, a seed semiconductor material layer may be patterned in a suitable template structure and localized islands of epitaxial semiconductor material may be formed on the individual template structures as embodiments herein are not limited in this context.

In some exemplary embodiments, a seed semiconductor material has a first relaxed lattice constant, and a semiconductor material having a second relaxed lattice constant is epitaxially grown in a strained state to more closely match the first relaxed lattice constant. For example, a $Si_xGe_{1-x}$ material layer may be epitaxially grown upon a $Si_yGe_{1-y}$ seed layer where x< >y and the thickness of the $Si_xGe_{1-x}$ is below the critical thickness so as to maintain a desired pseudomorphic strain (compressive or tensile) within the epitaxial material. In another example, a $Si_xGe_{1-x}$ material layer may be epitaxially grown upon a substantially pure Si seed layer or a substantially pure Ge seed layer and the thickness of the $Si_xGe_{1-x}$ is below the critical thickness so as to maintain a desired pseudomorphic strain (compressive or tensile) within the epitaxial material. In another example, substantially pure Si or Ge layer may be epitaxially grown upon a $Si_yGe_{1-y}$ seed layer where the thickness of the Si or Ge layer is below the critical thickness so as to maintain a desired pseudomorphic strain (compressive or tensile) within the epitaxial material.

Methods 301 continue at block 320 where a plurality of fin structures are formed by patterning through the epitaxial layer and at least partially into the seed layer. Any patterning processes known to be suitable for fin structure patterning may be employed at block 320. For example, a grating pattern of lines and spaces may be printed into a resist mask, and the epitaxial layer may be etched through with any dry (plasma) or wet etch process known to be suitable for the chemical composition of the epitaxial semiconductor material to define an upper portion of a fin structure. The same etch process, or an alternate more suitable for the chemical composition of the seed semiconductor material layer, may be employed to further define a base or sub-channel region of the stratified fin structure.

Figure 4A:
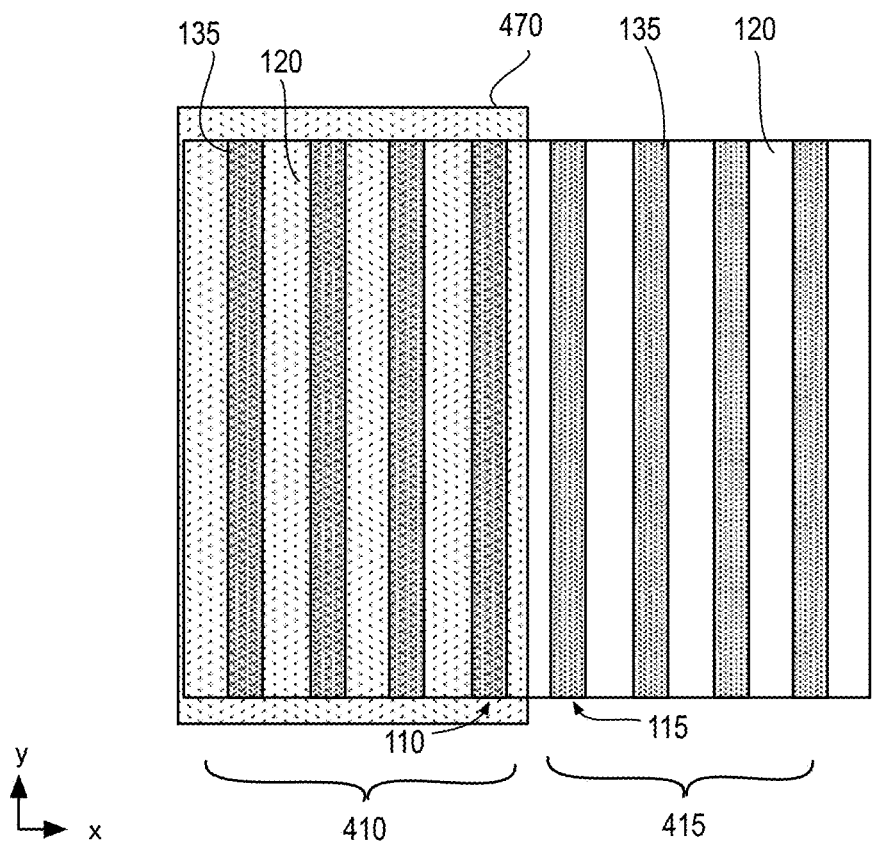
FIG. 4A illustrates a plan view of a plurality of fin structures that may be formed through the practice of the methods shown in FIG. 3, in accordance with some embodiments.
Figure 4B:
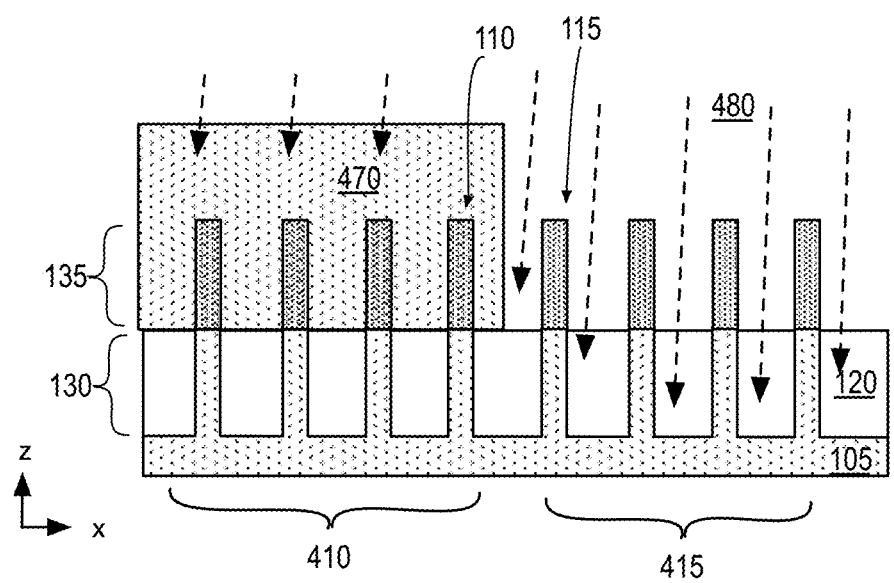
FIG. 4B illustrates a cross-sectional view of the fin structures illustrated in FIG. 4A, in accordance with some embodiments.

Various techniques may be further employed to define a dielectric material around the fin structures, and methods 301 continue at block 330 where defected regions are formed within the seed semiconductor material layer of a first subset of the fin structures, but not in a second subset of the fin structures. In some exemplary embodiments, block 330 comprises masking a subset of fin structures and implanting one or more impurity species into an unmasked subset of fin structures. FIG. 4A illustrates a plan view of a plurality of fin structures 410 and 415 that may be formed through the practice of the methods 301. As further shown, a mask material 470 is present over fin structures 410 while fin structures 415 are exposed. FIG. 4B further illustrates a cross-sectional view of fin structures 410, 415, in accordance with some embodiments. As shown in dashed line, an implant process 480 implants impurity species into semiconductor material 135 and into semiconductor material 130 of fin structures 415, as well as into dielectric material 120.

While the masking and implant process illustrated in FIG. 4A-4B may be similar to a well/isolation implant, in advantageous embodiments, at least one of $BF_2$, phosphorus, arsenic, antimony, indium, argon, xenon, nitrogen, fluorine, silicon or germanium is implanted into the unmasked subset of fin structures at a dose sufficient (e.g., at least $1e13/cm^2$) to induce a threshold number of defected regions within semiconductor material 130 at some location with semiconductor material 135 below the heterojunction. The threshold number of defected regions within semiconductor material 130 is advantageously within the fin structure (e.g., base) rather than in a substrate material below the fin structure where a strain relief response may be attenuated. Most lattice defects can be expected to be generated near an end-of-range for the implant energy enlisted. Hence, few, if any defected regions are expected within semiconductor material 135. As further illustrated, adjacent transistor structures 110 and 115 are at the interface of mask material 470 with transistor structure 110 being protected from implant process 480 while transistor structure 115 is exposed to implant process 480.

Upon generating the threshold number defected regions within semiconductor material 130, strain within semiconductor material 135 is relieved, and semiconductor material 135 relaxed from a pseudomorphic state to a metamorphic state. This exemplary strain-relieving implant may be performed at the same point as an isolation implant. Indeed if the strain-relieving implant does not also impart a desired electrical conductivity, an electrically active species may be additionally implanted with the same implant mask for the sake of electrical isolation. Although no defects are to be generated in the region protected by mask material 470, a complementary mask pattern may be enlisted to protect fin structures 415 while fin structures 410 are exposed to an electrical isolation/well implant. A lower dose and/or more efficiently activated dopant may be used to impart semiconductor material 130 with a desired conductivity type without generating defected regions.

Selective strain-relief through impurity implant defect generation may be practiced at other points in a transistor fabrication process than isolation implant. For example, a similar strain-relieving impurity implant may alternatively be performed at a point in a manufacturing flow where sub-channel doping may be introduced, for example. The strain-relieving impurity implant may also be performed at a number of another points in the fabrication of transistor structures.

Once the selective formation of defected regions complete, methods 301 may continue at block 340 where any techniques known to be suitable for fabricating NMOS and PMOS FETs on a fin structure may be practiced, for example to arrive at the IC structure 101 (FIG. 1) substantially as described above. Although a finFET architecture is one advantageous example, either or both of an NMOS transistor structure or PMOS transistor structure may instead have a different multi-gate architecture. Methods 301 may then be completed by fabricating any number of levels of metallization at block 350, for example to complete CMOS circuitry that includes both PMOS and NMOS transistor structures.

Depending on whether the seed semiconductor material compressively or tensilely strains the epitaxial layer, transistors of one conductivity type (e.g., n-type or p-type) are fabricated within the subset of fin structures that retain a pseudomorphic semiconductor material 135 while transistors of the complementary conductivity type (e.g., p-type or n-type) are fabricated within the subset of fin structures that have metamorphic semiconductor material 135.

Although the examples above are described in the context of a heterostructure fin including two material layers, one of which may have the same composition as an underlying substrate material, a fin structure may include any number of layers. For example, a heterostructure fin may include three material layers. In one example, a fin structure may include a core clad with a channel semiconductor material. The core of the fin structure may then be either pseudomorphic or metamorphic as dictated by a number of defected regions within a seed material. In another example, a fin core may have a number of defected regions, or not. A cladding epitaxially grown over the core may then be either pseudomorphic or metamorphic. The cladding may then be operative as channel semiconductor material having two different strain states substantially as described elsewhere herein. Thus, there are a wide variety of transistor architectures that may be adapted by one of ordinary skill to include strain-relieving defected regions that enable multiple strain states in a channel semiconductor material substantially as described herein.

Figure 5:
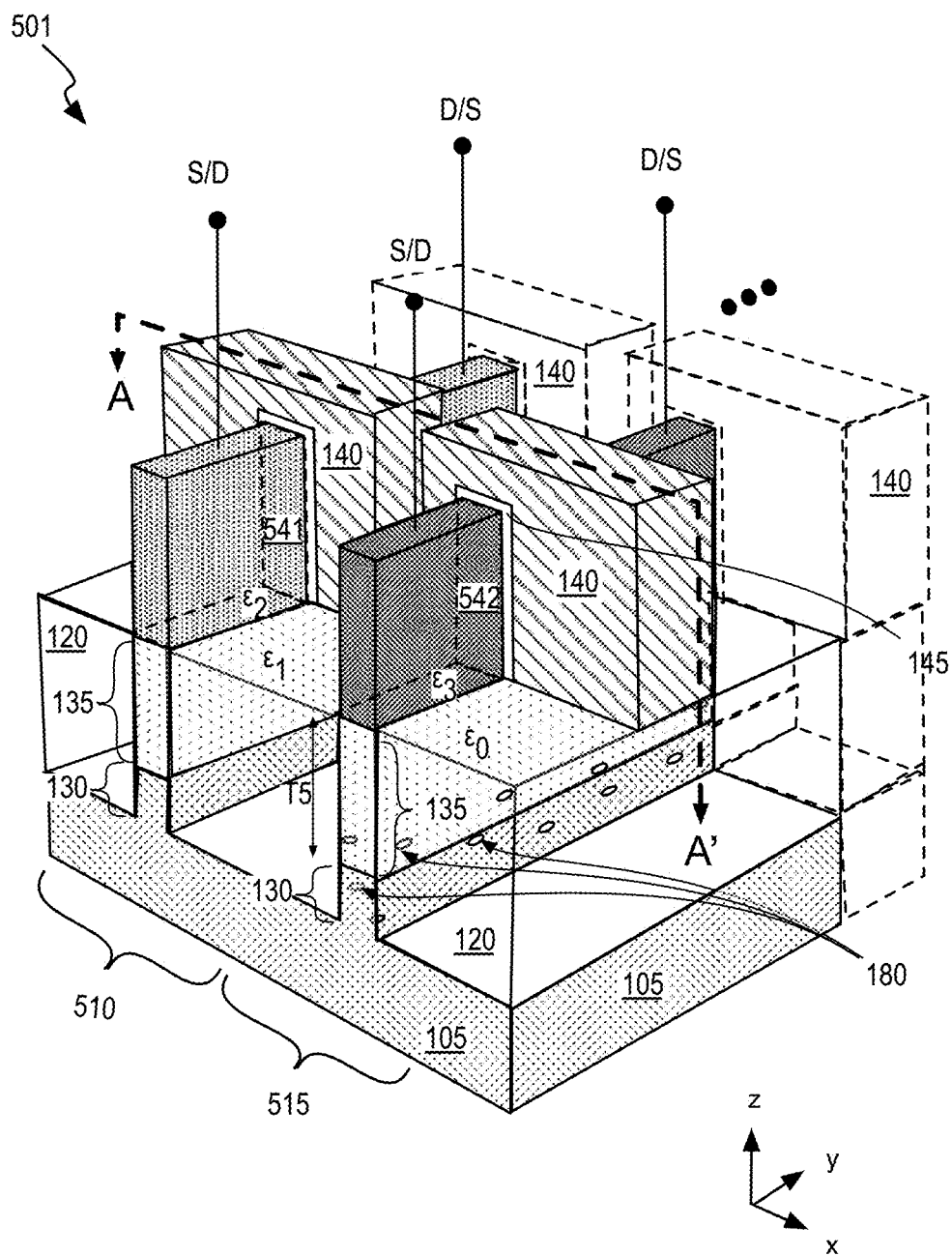
FIG. 5 depicts an isometric view of transistor structures having channel material with multiple strain states, in accordance with some alternative embodiments.

FIG. 5 depicts an isometric view of another IC structure 501 that includes transistor structures 510, 515 having channel material with multiple strain states, in accordance with some alternative embodiments. As shown, transistor structures 510 and 515 include three material layers. Semiconductor material 135 is again over semiconductor material 130. These crystalline material layers may have any of the attributes described above in the context of FIG. 1-4B, for example. In transistor structure 410 a third semiconductor material 541 is in contact with semiconductor material 135. In transistor structure 410, a fourth semiconductor material 542 is in contact with semiconductor material 135. As the gate stack (e.g., gate electrode 140 and gate dielectric 145) are adjacent to a sidewall of semiconductor materials 541 and 542, the transistor channel regions comprises these two compositionally different materials.

In the context of transistor structures 410, 415, semiconductor material 135 is a buffer, which has a composition suitable for imparting a compressive strain 82 upon a first of semiconductor materials 541, 542, and imparting a tensile strain $\varepsilon_3$ upon a second of semiconductor materials 541, 542. In some examples, semiconductor material 135 is a $Si_y$—$Ge_{1-y}$ alloy, with one example being $Si_{0.5}Ge_{0.5}$. Semiconductor material 541 may then be a first $Si_x$—$Ge_{1-x}$ alloy with x>y (e.g., x=0.8) so that semiconductor material 541 is tensilely strained by semiconductor material 135. Semiconductor material 542 may then be a second $Si_x$—$Ge_{1-x}$ alloy with x<y (e.g., x=0.2) so that semiconductor material 542 is compressively strained by semiconductor material 135.

Substrate material 105 may be substantially pure silicon or of any other composition (e.g., $Si_zGe_{1-z}$) that ensures semiconductor material 135 at a thickness T5 is pseudomorphic to semiconductor material 130 (e.g., substantially as described above in the context of IC structure 101). In other words, semiconductor material thickness T5 is less than the critical thickness for the compositions of semiconductor material 135 and substrate material 105. However, in the presence of defected regions 180, semiconductor material 135 decouples from substrate material 105 and its lattice parameters relax (e.g., becoming metamorphic). With semiconductor material 135 within transistor structure 415 in a relaxed strain state $\varepsilon_0$, semiconductor material 542 is in an enhanced state of greater strain (e.g., compressive) than it would be in for pseudomorphic semiconductor material 135. However, since semiconductor material 135 within transistor structure 410 remains in a pseudomorphic strain state Ci, semiconductor material 541 remains in a state strain $\varepsilon_3$ (e.g., tensile) that is greater than it would have for a relaxed semiconductor material 135.

Noting semiconductor material 135 is not channel material, and is instead a sub-channel buffer that buried within dielectric material 120, defected regions 180 may be present within either or both of semiconductor materials 130 and 135 at a sufficient number to induce a relaxation of semiconductor material 135 (e.g., from a pseudomorphic state to a metamorphic state). Thus, depending on the implementation, strain relieving impurity implant defects may either selectively reduce channel semiconductor strain or selectively enhance channel semiconductor strain. This selective enhancement or reduction of strain may be practiced to implement CMOS with different levels of strain between NMOS and PMOS devices that either employ the same channel material, or different channel materials.

Figure 6:
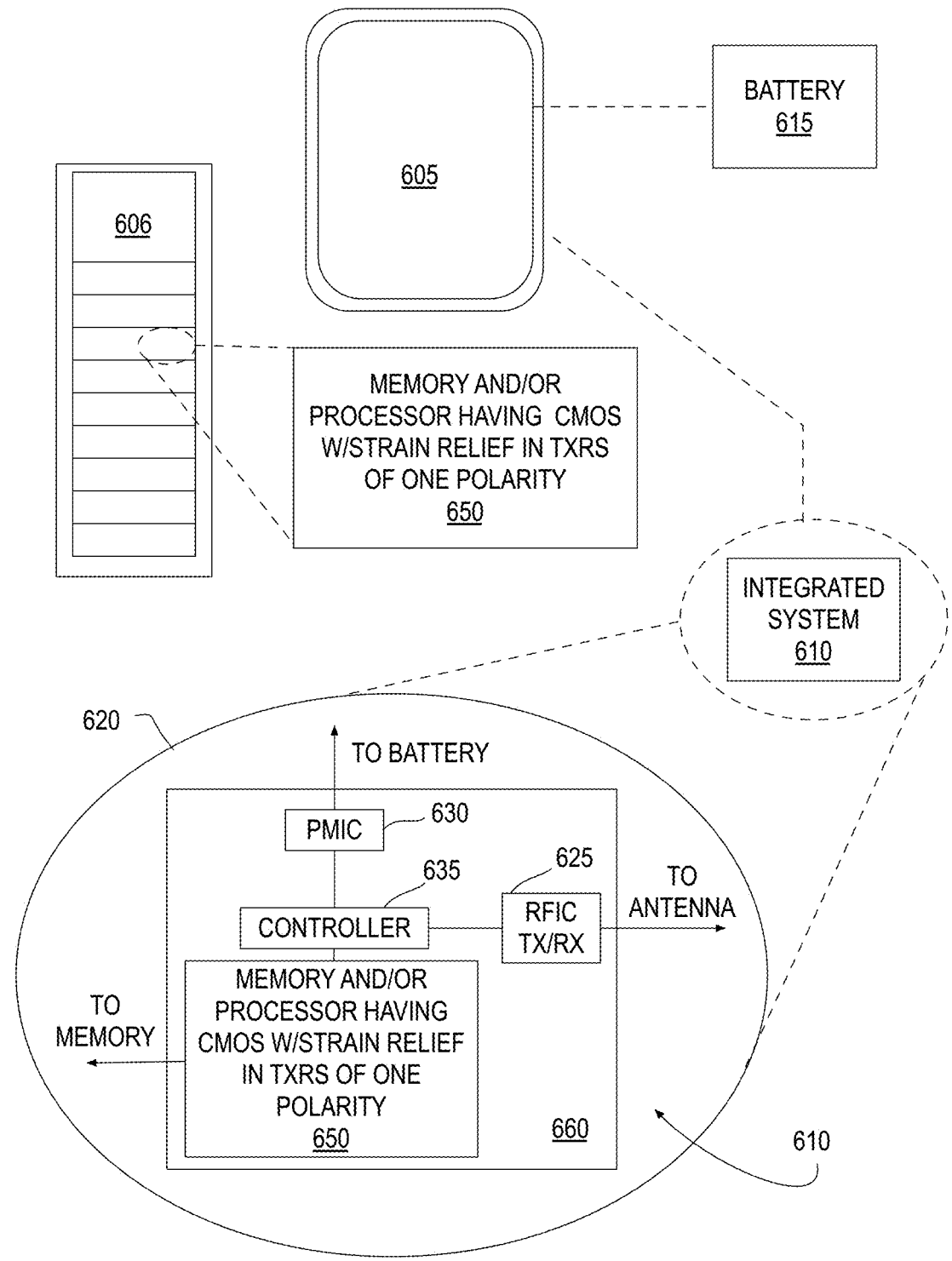
FIG. 6 illustrates a mobile computing platform and a data server machine employing an IC having transistor structures including channels with multiple strain states, in accordance with embodiments.

FIG. 6 illustrates a system in which a mobile computing platform 605 and/or a data server machine 606 employs a CMOS IC including at transistors with different strain states, for example in accordance with some defect-based strain relief embodiments describe elsewhere herein. The server machine 606 may be any commercial server, for example including any number of high-performance computing platforms disposed within a rack and networked together for electronic data processing, which in the exemplary embodiment includes a monolithic IC 650. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level integrated system 610, and a battery 615.

Whether disposed within the integrated system 610 illustrated in the expanded view 620, or as a stand-alone packaged chip within the server machine 606, IC 650 may include memory circuitry (e.g., RAM), or a logic circuitry (e.g., a microprocessor, a multi-core microprocessor, graphics processor, or the like) at least one of which further includes CMOS IC including at transistors with different strain states, for example in accordance with some defect-based strain relief embodiments describe elsewhere herein. IC 650 may be further coupled to a board, a substrate, or an interposer 660.

IC 650 may include a power management IC (PMIC) 630 coupled to a power source such as a battery and to regulate power to other circuits of IC 650. IC 650 may include a RF transceiver IC (RFIC) 625, for examples having an input coupled to other circuitry of IC 650 and an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. IC 650 may further include a controller IC 635 coupled to any or all of ICs 650, 630 or 625.

Figure 7:
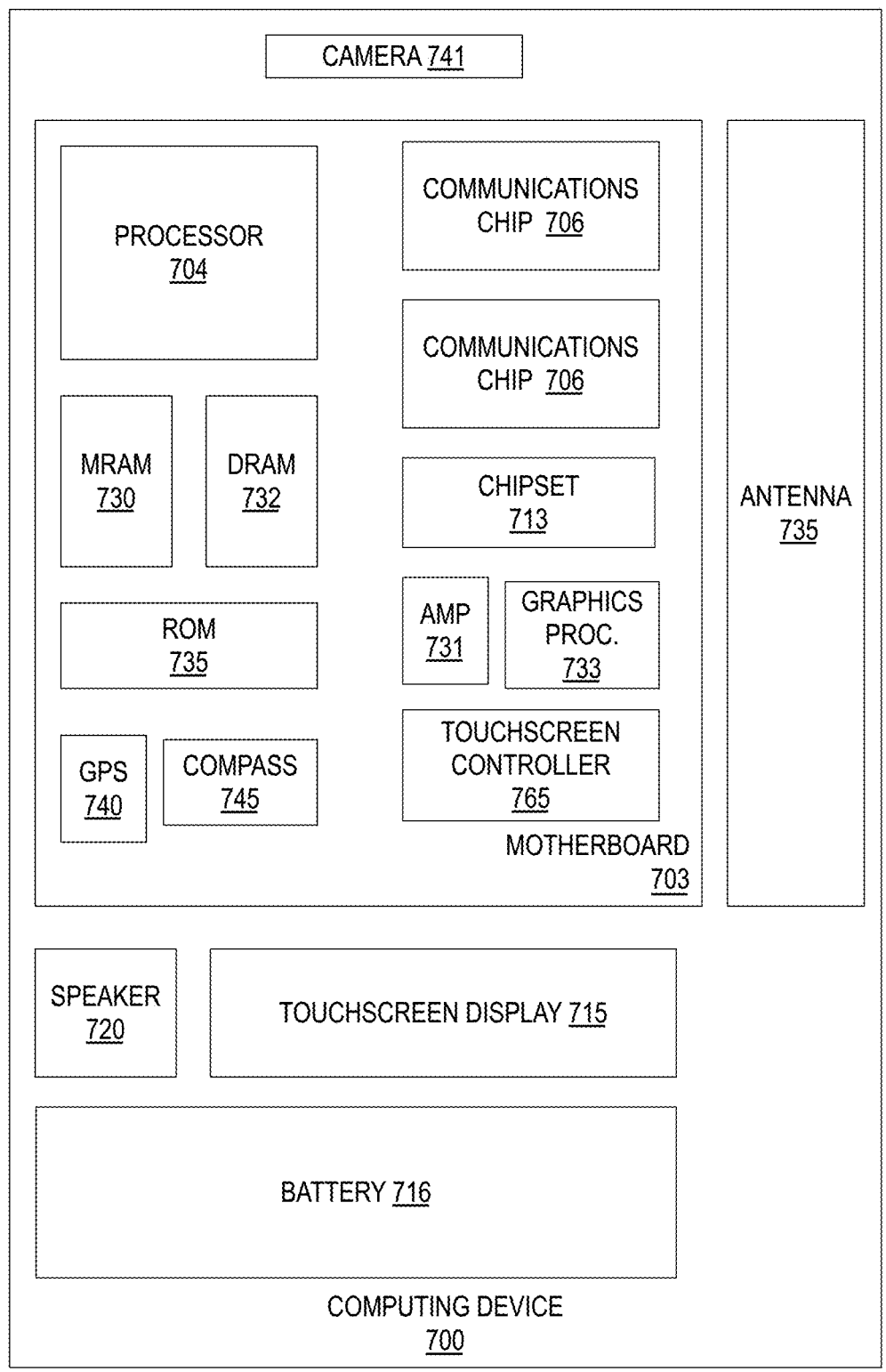
FIG. 7 is a functional block diagram of an electronic computing device, in accordance with some embodiments.

FIG. 7 is a functional block diagram of an electronic computing device 700, in accordance with some embodiments. Device 700 further includes a motherboard 703 hosting a number of components, such as, but not limited to, a processor 704 (e.g., an applications processor). Processor 704 may be physically and/or electrically coupled to motherboard 703. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 703. In further implementations, communication chips 706 may be part of processor 704. Depending on its applications, computing device 700 may include other components that may or may not be physically and electrically coupled to motherboard 703. These other components include, but are not limited to, volatile memory (e.g., DRAM 732), non-volatile memory (e.g., ROM 735), flash memory (e.g., NAND or NOR), magnetic memory (MRAM 730), a graphics processor 733, a digital signal processor, a crypto processor, a chipset 713, an antenna 735, touchscreen display 715, touchscreen controller 765, battery 716, audio codec, video codec, power amplifier 731, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth, or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including, but not limited to, those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) structure comprises a first transistor structure comprising a first fin heterostructure including a first layer of crystalline material over a second layer of crystalline material. The IC structure further comprises a second transistor structure comprising a second fin heterostructure including the first layer of crystalline material over the second layer of crystalline material. Within the second layer, a number of defected regions of a threshold minimum dimension varies between the first fin and the second fin heterostructure.

In second examples, for any of the first examples the second layer has a thickness between the first layer and an underlying substrate material. The defected regions are interspersed within the second layer, and most prevalent within a band of the second layer that is substantially parallel to a plane of the substrate material, the band occupying less than the thickness of the second layer.

In third examples, for any of the first through second examples the threshold minimum dimension is larger than a point defect.

In fourth examples, for any of the first through third examples the first transistor structure is a first conductivity type, and the second transistor structure is a second conductivity type, complementary to the first conductivity type.

In fifth examples, for any of the fourth examples the first layer of crystalline material has a first majority atom composition comprising at least one of Si and Ge, and wherein the second layer of crystalline material has a second majority atom composition comprising at least one of Si and Ge.

In sixth examples, for any of the fourth examples, within the second layer, a concentration of an impurity varies between the first fin heterostructure and the second fin heterostructure.

In seventh examples, for any of the sixth examples the impurity comprises at least one of argon, xenon, silicon, nitrogen, fluorine or germanium, indium, or antimony.

In eighth examples, for any of the sixth through seventh examples, within the second layer, the impurity present within the second fin heterostructure is absent from the first fin heterostructure.

In ninth examples, for any of the eighth examples, the first transistor is an NMOS device, the second transistor is a PMOS device, and the impurity is antimony. The first transistor is a PMOS device, the second transistor is a NMOS device, and the impurity comprises fluorine or indium.

In tenth examples, for any of the fifth examples the first majority atom composition comprises more Ge than the second majority atom composition.

In eleventh examples, for any of the first through tenth examples the first layer of crystalline material has a first lattice spacing, and the second layer of crystalline material has a second lattice spacing. The first lattice spacing is more closely matched to the second lattice spacing within the first fin heterostructure than within the second fin heterostructure.

In twelfth examples, for any of the eleventh examples a first gate stack is adjacent to a first sidewall of the first fin heterostructure, the first sidewall comprising the first layer of crystalline material. A first source and drain semiconductor material is coupled to the first layer of crystalline material and on opposite sides of the first gate stack. The first source and drain semiconductor material is a first conductivity type. A second gate stack is adjacent to a second sidewall of the second fin heterostructure. The second sidewall comprises the first layer of crystalline material. A second source and drain semiconductor material is coupled to the first layer of crystalline material and on opposite sides of the second gate stack. The second source and drain semiconductor material is a second conductivity type, complementary to the first conductivity type.

In thirteenth examples, for any of the twelfth examples the first layer of crystalline material comprises $Si_xGe_{1-x}$, and x is less than 0.8. The second layer of crystalline material comprises Si with less Ge than the first layer. The first conductivity type is p-type. The second conductivity type is n-type.

In fourteenth examples, for any of the twelfth examples the second layer of crystalline material comprises $Si_xGe_{1-x}$, and x is less than 0.8, the first layer of crystalline material comprises Si with less Ge than the second layer, the first conductivity type is n-type, and the second conductivity type is p-type.

In fifteenth examples, for any of the first examples the first fin heterostructure further comprises a third layer of crystalline material on the first layer. The third layer has a third majority atom composition, different than the first majority atom composition. The second fin heterostructure further comprises a fourth layer of crystalline material on the first layer. The fourth layer has a fourth majority atom composition, different than both the first majority atom composition and the third majority atom composition.

In sixteenth examples, for any of the fifteenth examples a first gate stack is adjacent to a first sidewall of the first fin heterostructure. The first sidewall comprises the third layer of crystalline material. A first source and drain semiconductor material is coupled to the third layer of crystalline material and on opposite sides of the first gate stack. The first source and drain semiconductor material is a first conductivity type. A second gate stack is adjacent to a second sidewall of the second fin heterostructure. The second sidewall comprises the fourth layer of crystalline material. A second source and drain semiconductor material is coupled to the fourth layer of crystalline material and on opposite sides of the second gate stack. The second source and drain semiconductor material is of a second conductivity type, complementary to the first conductivity type.

In seventeenth examples, for any of the sixteenth examples the first layer of crystalline material comprises $Si_xGe_{1-x}$, and x is at least 0.5. The second layer of crystalline material comprises substantially pure Si. The third layer of crystalline material comprises $Si_yGe_{1-y}$, and y is less than x. The fourth layer of crystalline material comprises $Si_zGe_{1-}$ z, and z is more than x. The first conductivity type is p-type, and the second conductivity type is n-type.

In eighteenth examples, an integrated circuit (IC) structure comprises a PMOS transistor structure comprising a first fin structure including a pseudomorphic layer of crystalline $Si_xGe_{1-x}$ material directly on a crystalline base layer having a different Ge concentration than the pseudomorphic layer. A first gate stack is adjacent to a sidewall of first fin structure, and in contact with the pseudomorphic layer of the crystalline $Si_xGe_{1-x}$ material. A p-type source and p-type drain semiconductor material is coupled to the pseudomorphic layer of the crystalline material, and on opposite sides of the first gate stack. The IC structure further comprises an NMOS transistor structure comprising a second fin structure including a metamorphic layer of the crystalline material directly on the crystalline base layer. A second gate stack is adjacent to a sidewall of the second fin structure and in contact with the metamorphic layer of the crystalline $Si_xGe_{1-x}$ material. An n-type source and an n-type drain semiconductor material is coupled to the metamorphic layer of the crystalline $Si_xGe_{1-x}$ material, and on opposite sides of the first gate stack. Within the crystalline base layer, there are more defected regions of a threshold minimum dimension in the second fin structure than in the first fin structure.

In nineteenth examples, for any of the eighteenth examples the base layer has a thickness over an underlying substrate material, and the defected regions are interspersed within a band of the base layer that is substantially parallel to a plane of the substrate material, the band occupying less than the thickness of the base layer. The threshold minimum dimension is larger than a point defect.

In twentieth examples, for any of the eighteenth through nineteenth examples, within the second fin structure, the crystalline base layer comprises a dopant that is absent from the crystalline base layer of the first fin structure, and wherein the dopant comprises fluorine or indium.

In twenty-first examples, an electronic device comprises a power supply, and a CMOS IC coupled to receive power from the power supply. The CMOS IC includes a PMOS transistor structure and an NMOS transistor structure. A first of the PMOS transistor structure or the NMOS transistor structure comprises a first fin structure including a pseudomorphic crystalline channel material directly on a crystalline seed material having a different material composition than the channel material, a first gate stack adjacent to a sidewall of first fin structure, and in contact with the pseudomorphic crystalline channel material, and a first source and drain semiconductor material coupled to the pseudomorphic crystalline channel material, and on opposite sides of the first gate stack. A second of the PMOS transistor structure or the NMOS transistor structure comprises a second fin structure including a metamorphic crystalline channel material directly on the crystalline seed material, wherein the metamorphic crystalline channel material has substantially the same composition as the pseudomorphic crystalline channel material, a second gate stack adjacent to a sidewall of first fin structure, and in contact with the metamorphic crystalline channel material, and a second drain semiconductor material coupled to the metamorphic crystalline channel material, and on opposite sides of the first gate stack. Within the seed layer, there are more defected regions of a threshold minimum dimension in the second fin structure than in the first fin structure.

In twenty-second examples, for any of the twenty-first examples the crystalline seed material comprises predominantly silicon, and has a thickness over an underlying crystalline silicon substrate material, and wherein the defected regions are interspersed within a band of the seed material that is substantially parallel to a plane of the crystalline silicon substrate material, the band occupying less than the thickness of the seed material, and individual ones of the defected regions comprise at least one hundred lattice atoms.

In twenty-third examples, for any of the twenty-first through twenty-second examples within the second fin structure, the crystalline seed material comprises an impurity that is absent from the crystalline seed material of the first fin structure.

In twenty-fourth examples, for any of the twenty-third examples the impurity comprises at least one of argon, xenon, silicon, nitrogen, fluorine or germanium, indium, or antimony.

In twenty-fifth examples, a method of fabricating an integrated circuit structure comprises epitaxially forming a first semiconductor material over a crystalline seed material, the first semiconductor material strained to accommodate a lattice parameter of the seed material. The method comprises forming a plurality of fin structures through the first semiconductor material and at least partially through the seed material. The method comprises relaxing strain in the first semiconductor material of at least a first of the fin structures by implanting an impurity into the seed material, and forming a gate, a source, and a drain coupled to at least the first of the fin structures.

In twenty-sixth examples, for any of the twenty fifth examples epitaxially forming the first semiconductor material over the crystalline seed material further comprises growing a $Si_xGe_{1-x}$ material layer upon a $Si_yGe_{1-y}$ seed layer, wherein x<>y, and a thickness of the $Si_xGe_{1-x}$ layer is below a critical thickness.

In twenty-seventh examples, for any of the twenty-fifth through twenty-sixth examples epitaxially forming the first semiconductor material over the crystalline seed material further comprises epitaxially growing $Si_xGe_{1-x}$ material layer upon a substantially pure Si seed layer or a substantially pure Ge seed layer, and the thickness of the $Si_xGe_{1-x}$ layer is below a critical thickness.

In twenty-eighth examples, for any of the twenty-sixth examples x is between 0.2 and 0.4, relaxing strain in the first semiconductor material of at least the first of the fin structures further comprises implanting at least one of phosphorus, arsenic, antimony, argon, xenon, nitrogen, fluorine, silicon or germanium in the first of the fin structures while a second of the fin structures is protected from the implanting. Forming a gate, a source, and a drain coupled to at least the first of the fin structures further comprises forming a first gate and an n-type source and an n-type drain coupled to the first of the fin structures, and forming a second gate and a p-type source and an p-type drain coupled to the second of the fin structures.

In twenty-ninth examples, for any of the twenty-fifth through twenty-eighth examples epitaxially forming the first semiconductor material over the crystalline seed material further comprises epitaxially growing a substantially pure Si or Ge material layer upon a $Si_yGe_{1-y}$ seed layer, and wherein the thickness of the Si or Ge material layer is below a critical thickness.

In thirtieth examples, for any of the twenty ninth examples relaxing strain in the first semiconductor material of at least the first of the fin structures by implanting an impurity into the seed material further comprises implanting at least one of $BF_2$, phosphorus, arsenic, antimony, indium, argon, xenon, nitrogen, fluorine, silicon or germanium.

In thirty-first examples, for any of the thirtieth examples the implanting is at a dose of at least 1e13/cm².

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   a first transistor structure comprising a first fin heterostructure including a first layer of crystalline material over a second layer of crystalline material, wherein the first layer of crystalline material has a first majority atom composition comprising at least one of Si and Ge, and wherein the second layer of crystalline material has a second majority atom composition comprising at least one of Si and Ge; and
   a second transistor structure comprising a second fin heterostructure including the first layer of crystalline material over the second layer of crystalline material, wherein, within the second layer, a number of defected regions of a threshold minimum dimension larger than a point defect varies between the first fin heterostructure and the second fin heterostructure.

2. The IC structure of claim 1, wherein the second layer has a thickness between the first layer and an underlying substrate material, and wherein the defected regions are interspersed within the second layer, and most prevalent within a band of the second layer that is substantially parallel to a plane of the substrate material, the band occupying less than the thickness of the second layer.

3. The IC structure of claim 1, wherein:
   a channel region of both the first and second transistor structures comprise the first layer of crystalline material;
   the first transistor structure further comprises a first source and drain material of a first conductivity type coupled to the first layer of crystalline material and on opposite sides of a first gate stack;
   the second transistor structure further comprises a second source and drain material of a second conductivity type coupled to the first layer of crystalline material and on opposite sides of a second gate stack.

4. The IC structure of claim 1, wherein the first transistor structure is of a first conductivity type, and the second transistor structure is of a second conductivity type, complementary to the first conductivity type.

5. The IC structure of claim 1, wherein, within the second layer, a concentration of an impurity varies between the first fin heterostructure and the second fin heterostructure.

6. The IC structure of claim 5, wherein the impurity comprises at least one of argon, xenon, silicon, nitrogen, fluorine or germanium, indium, or antimony.

7. The IC structure of claim 6, wherein:
   the first transistor is an NMOS device, the second transistor is a PMOS device, and the impurity is antimony; or
   the first transistor is an PMOS device, the second transistor is a NMOS device, and the impurity comprises fluorine or indium.

8. The IC structure of claim 5, wherein, within the second layer, the impurity present within the second fin heterostructure is absent from the first fin heterostructure.

9. The IC structure of claim 1, wherein the first majority atom composition comprises more Ge than the second majority atom composition.

10. The IC structure of claim 1, wherein, the first layer of crystalline material has a first lattice spacing, and the second layer of crystalline material has a second lattice spacing, and wherein the first lattice spacing is more closely matched to the second lattice spacing within the first fin heterostructure than within the second fin heterostructure.

11. The IC structure of claim 1, further comprising:
   a first gate stack adjacent to a first sidewall of the first fin heterostructure, the first sidewall comprising the first layer of crystalline material;
   a first source and drain semiconductor material coupled to the first layer of crystalline material and on opposite sides of the first gate stack, wherein the first source and drain semiconductor material is a first conductivity type;
   a second gate stack adjacent to a second sidewall of the second fin heterostructure, the second sidewall comprising the first layer of crystalline material; and
   a second source and drain semiconductor material coupled to the first layer of crystalline material and on opposite sides of the second gate stack, wherein the second source and drain semiconductor material is a second conductivity type, complementary to the first conductivity type.

12. The IC structure of claim 11, wherein:
   the first layer of crystalline material comprises $Si_xGe_{1-x}$, and x is less than 0.8;
   the second layer of crystalline material comprises Si with less Ge than the first layer;
   the first conductivity type is p-type; and
   the second conductivity type is n-type.

13. The IC structure of claim 11, wherein:
   the second layer of crystalline material comprises $Si_xGe_{1-x}$, and x is less than 0.8;
   the first layer of crystalline material comprises Si with less Ge than the second layer;
   the first conductivity type is n-type; and
   the second conductivity type is p-type.

14. The IC structure of claim 1, wherein:
   the first fin heterostructure further comprises a third layer of crystalline material on the first layer, the third layer having a third majority atom composition, different than the first majority atom composition; and
   the second fin heterostructure further comprises a fourth layer of crystalline material on the first layer, the fourth layer having a fourth majority atom composition, different than both the first majority atom composition and the third majority atom composition.

15. The IC structure of claim 14, further comprising:
   a first gate stack adjacent to a first sidewall of the first fin heterostructure, the first sidewall comprising the third layer of crystalline material;
   a first source and drain semiconductor material coupled to the third layer of crystalline material and on opposite sides of the first gate stack, wherein the first source and drain semiconductor material is of a first conductivity type;
   a second gate stack adjacent to a second sidewall of the second fin heterostructure, the second sidewall comprising the fourth layer of crystalline material; and a second source and drain semiconductor material coupled to the fourth layer of crystalline material and on opposite sides of the second gate stack, wherein the second source and drain semiconductor material is of a second conductivity type, complementary to the first conductivity type.

16. The IC structure of claim 15, wherein:
the first layer of crystalline material comprises $Si_xGe_{1-x}$, and x is at least 0.5;
the second layer of crystalline material comprises substantially pure Si;
the third layer of crystalline material comprises $Si_yGe_{1-y}$, and y is less than x;
the fourth layer of crystalline material comprises $Si_zGe_{1-z}$, and z is more than x;
the first conductivity type is p-type; and
the second conductivity type is n-type.

17. An integrated circuit (IC) structure, comprising:
a PMOS transistor structure comprising:
  a first fin structure including a pseudomorphic layer of crystalline $Si_xGe_{1-x}$ material directly on a crystalline base layer having a different Ge concentration than the pseudomorphic layer;
  a first gate stack adjacent to a sidewall of first fin structure, and in contact with the pseudomorphic layer of the crystalline $Si_xGe_{1-x}$ material; and
  a p-type source and p-type drain semiconductor material coupled to the pseudomorphic layer of the crystalline $Si_xGe_{1-x}$ material, and on opposite sides of the first gate stack;
an NMOS transistor structure comprising:
  a second fin structure including a metamorphic layer of the crystalline $Si_xGe_{1-x}$ material directly on the crystalline base layer;
  a second gate stack adjacent to a sidewall of the second fin structure and in contact with the metamorphic layer of the crystalline $Si_xGe_{1-x}$ material; and
  an n-type source and an n-type drain semiconductor material coupled to the metamorphic layer of the crystalline $Si_xGe_{1-x}$ material, and on opposite sides of the first gate stack, wherein, within the crystalline base layer, there are more defected regions of a threshold minimum dimension in the second fin structure than in the first fin structure.

18. The IC structure of claim 17, wherein:
the base layer has a thickness over an underlying substrate material, and wherein the defected regions are interspersed within a band of the base layer that is substantially parallel to a plane of the substrate material, the band occupying less than the thickness of the base layer; and
the threshold minimum dimension is larger than a point defect.

19. The IC structure of claim 17, wherein, within the second fin structure, the crystalline base layer comprises a dopant that is absent from the crystalline base layer of the first fin structure, and wherein the dopant comprises fluorine or indium.

20. An electronic device, comprising:
a power supply; and
a CMOS IC coupled to receive power from the power supply, wherein the CMOS IC includes a PMOS transistor structure and an NMOS transistor structure, and wherein:
  a first of the PMOS transistor structure or the NMOS transistor structure comprises:
    a first fin structure including a pseudomorphic crystalline channel material directly on a crystalline seed material having a different material composition than the channel material;
    a first gate stack adjacent to a sidewall of first fin structure, and in contact with the pseudomorphic crystalline channel material; and
    a first source and drain semiconductor material coupled to the pseudomorphic crystalline channel material, and on opposite sides of the first gate stack; and
  a second of the PMOS transistor structure or the NMOS transistor structure comprises:
    a second fin structure including a metamorphic crystalline channel material directly on the crystalline seed material, wherein the metamorphic crystalline channel material has substantially the same composition as the pseudomorphic crystalline channel material;
    a second gate stack adjacent to a sidewall of first fin structure, and in contact with the metamorphic crystalline channel material; and
    a second drain semiconductor material coupled to the metamorphic crystalline channel material, and on opposite sides of the first gate stack; and
  within the seed material, there are more defected regions of a threshold minimum dimension in the second fin structure than in the first fin structure.

21. The device of claim 20, wherein:
the crystalline seed material comprises predominantly silicon, and has a thickness over an underlying crystalline silicon substrate material, and wherein the defected regions are interspersed within a band of the seed material that is substantially parallel to a plane of the crystalline silicon substrate material, the band occupying less than the thickness of the seed material; and
individual ones of the defected regions comprise at least one hundred lattice atoms.

22. The device of claim 20, wherein, within the second fin structure, the crystalline seed material comprises an impurity that is absent from the crystalline seed material of the first fin structure.

23. The device of claim 22, wherein the impurity comprises at least one of argon, xenon, silicon, nitrogen, fluorine or germanium, indium, or antimony.

* * * * *